(12) United States Patent
Kobayashi et al.

(10) Patent No.: US 6,337,171 B1
(45) Date of Patent: Jan. 8, 2002

(54) RADIATION-SENSITIVE RESIN COMPOSITION

(75) Inventors: Eiichi Kobayashi; Yukio Nishimura; Takeo Shioya, all of Mie (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/435,922

(22) Filed: Nov. 8, 1999

(30) Foreign Application Priority Data

Nov. 10, 1998 (JP) .......................................... 10-318559

(51) Int. Cl.$^7$ .............................................. G03F 7/004
(52) U.S. Cl. .................................... 430/270.1; 430/914
(58) Field of Search ............................... 430/270.1, 914

(56) References Cited

U.S. PATENT DOCUMENTS

| | | | |
|---|---|---|---|
| 5,512,417 A | | 4/1996 | Ban et al. ............... 430/270.14 |
| 5,585,220 A | | 12/1996 | Breyta et al. ............. 430/270.1 |
| 5,691,112 A | * | 11/1997 | Watanabe et al. ......... 430/270.1 |
| 5,759,739 A | * | 6/1998 | Takemura et al. ........ 430/270.1 |
| 5,780,206 A | * | 7/1998 | Urano et al. ................. 430/325 |
| 5,824,824 A | * | 10/1998 | Osawa et al. .................. 568/49 |
| 5,989,775 A | * | 11/1999 | Park et al. ................ 430/270.1 |
| 6,066,433 A | * | 5/2000 | Takemura et al. ........ 430/270.1 |

FOREIGN PATENT DOCUMENTS

| | | |
|---|---|---|
| EP | 0 619 522 A2 | 10/1994 |
| EP | 0 701 171 A1 | 3/1996 |
| EP | 1 033 624 A1 | 9/2000 |
| JP | 6 123970 | 5/1994 |
| JP | 9 124533 | 5/1997 |
| WO | WO95/16671 | 6/1995 |

OTHER PUBLICATIONS

Hattori, T. et al., "Chemical amplification positive deep ultraviolet resist by means of partially tetrahydropyranyl--protected polyvinylphenol", Optical Engineering, vol. 32, No. 10, pp. 2368–2374 (1993).

* cited by examiner

*Primary Examiner*—Rosemary Ashton
(74) *Attorney, Agent, or Firm*—Piper Marbury; Rudnick & Wolfe, LLP; Steven B. Kelber

(57) ABSTRACT

A radiation-sensitive resin composition comprising (A) resin which comprises a recurring unit (1) shown by the following formula (1) and either or both of a recurring unit (2) shown by the following formula (2) and a recurring unit (3) shown by the following formula (3), and (B) a photoacid generator shown by the following formula (4).

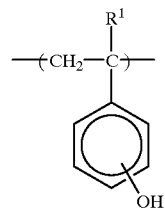

(1)

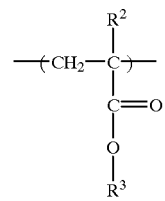

(2)

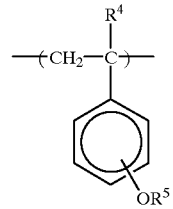

(3)

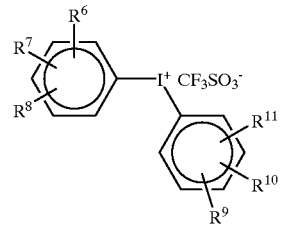

(4)

25 Claims, No Drawings

RADIATION-SENSITIVE RESIN COMPOSITION

BACKGROUND OF THE INVENTION

1. Field of the Invention

The present invention relates to a radiation-sensitive resin composition useful for microfabrication using various types of radiation, in particular, such as far ultraviolet rays represented by a KrF excimer laser, charged particle rays such as electron beams, and X-rays such as synchrotron radiation.

2. Description of Background Art

As a resist applicable to far ultraviolet rays such as a KrF excimer laser, charged particle rays such as electron beams, and X-rays such as synchrotron radiation, a chemically-amplified resist comprising a photoacid generator which can increase the sensitivity by the catalytic action of an acid formed by the photoacid generator upon irradiation with radioactive rays (hereinafter called "exposure") has been proposed.

The following problem has been pointed out for conventional chemically-amplified resists. Specifically, because of the time delay from exposure to heating after exposure (hereinafter referred to as "PED"), the line width of the resist pattern varies or the resist pattern changes into a T-shape. In recent years, various chemically-amplified resists which can be applied to the manufacture of semiconductor devices have been proposed. For example, Japanese Patent Application Laid-open No. 209868/1995 has disclosed a chemically-amplified radiation-sensitive resin composition comprising a polymer which comprises a hydroxystyrene recurring unit, a t-butyl (meth)acrylate recurring unit, and a recurring unit which reduces the solubility of the polymer in an alkaline developer after exposure.

However, as the design dimensions of the devices become more minute such as half micron or less, the chemically amplified resist exhibits defects during development ("defective development") such as development failure in the minute pattern, fall down of the pattern, and changes in the line width due to unevenness in the solubility of the exposed area in the developer to decrease the yield.

In view of the above situation of the conventional technology, an object of the present invention is to provide a radiation-sensitive resin composition useful as a chemically-amplified resist which exhibits no defective development, and does not cause the line width to change nor the resist pattern to change into a T-shape due to PED. Another object of the present invention is to provide a radiation-sensitive resin composition which exhibits high sensitivity to various radiations such as far ultraviolet rays such as a KrF excimer laser, charged particle rays such as electron beams, and X-rays such as synchrotron radiation and exhibits superior resolution.

SUMMARY OF THE INVENTION

According to the present invention, the above objects can be achieved by a radiation-sensitive resin composition comprising:

(A) a resin which comprises a recurring unit (1) shown by the following formula (1) and either or both of a recurring unit (2) shown by the following formula (2) and a recurring unit (3) shown by the following formula (3):

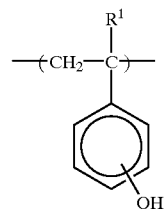

(1)

wherein $R^1$ represents a hydrogen atom or a methyl group;

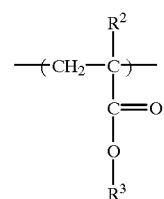

(2)

wherein $R^2$ represents a hydrogen atom or a methyl group and $R^3$ represents a tertiary alkyl group having 4–10 carbon atoms or a 1,1-dimethyl-3-oxobutyl group;

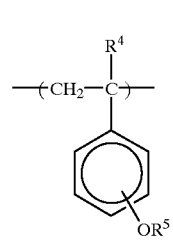

(3)

wherein $R^4$ represents a hydrogen atom or a methyl group and $R^5$ represents a t-butyl group or acetyl group; and
(B) a photoacid generator shown by the following formula

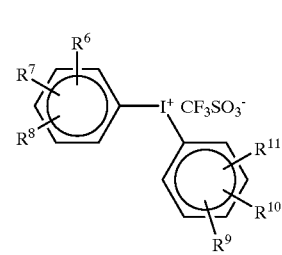

(4)

wherein (a) $R^6$–$R^{11}$ individually represent a hydrogen atom or a monovalent organic group having 1–6 carbon atoms, provided that at least one of $R^6$–$R^{11}$ represents a group other than a hydrogen atom; provided further that, (b) two among $R^6$–$R^8$ may form a 3–8 membered cyclic structure together with the carbon atoms of the benzene ring to which these groups are bonded, (c) $R^9$–$R^{11}$ may form a 3–8 membered cyclic structure together with the carbon atoms in the benzene ring to which these groups are bonded, or (d) two among $R^6$–$R^8$ may form a 3–8 membered cyclic structure together with the carbon atoms of the benzene ring to which these groups are bonded and two among $R^9$–$R^{11}$ may form a 3–8 membered cyclic structure together with the carbon atoms in the benzene ring to which these groups are bonded.

Other objects, features and advantages of the invention will hereinafter become more readily apparent from the following description.

DETAILED DESCRIPTION OF THE INVENTION AND PREFERRED EMBODIMENT

The present invention will be described in detail.

(A) Resin

The component (A) of the present invention is a resin comprising the recurring unit (1) and either the recurring unit (2) or the recurring unit (3), or both (hereinafter referred to as "resin (A)").

As the recurring unit (1), units derived from p-hydroxystyrene and the like are particularly preferable.

In the formula (2) which shows the recurring unit (2), examples of a tertiary alkyl group having 4–10 carbon atoms represented by $R^3$ include a t-butyl group, 1,1-dimethylpropyl group, 1-methyl-1-ethylpropyl group, 1,1-diethylpropyl group, 1,1-dimethylbutyl group, 1-methyl-1-ethylbutyl group, 1,1-diethylbutyl group, 1,1-dimethylpentyl group, 1-methyl-1-ethylpentyl group, 1,1-diethylpentyl group, 1,1-dimethylhexyl group, 1-methyl-1-ethylhexyl group, 1,1-diethylhexyl group, 1,1-dimethylheptyl group, 1-methyl-1-ethylheptyl group, 1,1-dimethyloctyl group, and the like.

A t-butyl group, 1,1-dimethylpropyl group, 1,1-dimethyl-3-oxobutyl group (—C (CH$_3$)$_2$CH$_2$C(=O) CH$_3$), and the like are particularly preferable as $R^3$.

As the recurring unit (3), units derived from p-t-butoxystyrene, p-acetyloxystyrene, and the like are preferable. P-t-butoxystyrene is particularly preferable.

In the resin (A), various types of groups for the recurring units (1), (2), and (3) mentioned above may be used either individually or in combinations of two or more.

The resin (A) can comprise at least one recurring unit other than the recurring units (1), (2), and (3) (hereinafter referred to as "other recurring units").

Among monomers which can be used as the other recurring units, examples of monofunctional monomers having one polymerizable unsaturated group in the molecule include vinyl aromatic compounds such as styrene, α-methylstyrene, o-methylstyrene, m-methylstyrene, p-methylstyrene, o-methoxystyrene, m-methoxystyrene, and p-methoxystyrene; unsaturated carboxylic acids or acid anhydrides thereof such as (meth)acrylic acid, maleic acid, fumaric acid, crotonic acid, mesaconic acid, citraconic acid, itaconic acid, maleic anhydride, and citraconic anhydride; esters such as methyl ester, ethyl ester, n-propyl ester, i-propyl ester, n-butyl ester, i-butyl ester, sec-butyl ester, t-butyl ester (excluding t-butyl (meth)acrylate), N-amyl ester, n-hexyl ester, cyclohexyl ester, 2-hydroxyethyl ester, 2-hydroxypropyl ester, 3-hydroxypropyl ester, 2,2-dimethyl-3-hydroxypropyl ester, benzyl ester, isobornyl ester, tricyclodecanyl ester, and 1-adamantyl ester of the above unsaturated carboxylic acids; unsaturated nitriles such as (meth)acrylonitrile, maleinitrile, fumarnitrile, mesaconitrile, citraconitrile, and itaconitrile; unsaturated amides such as (meth)acrylamide, crotonamide, maleinamide, fumaramide, mesaconamide, citraconamide, and itaconamide; unsaturated imides such as maleimide, N-phenylmaleimide, and N-cyclohexylmaleimide; unsaturated alcohols such as (meth)allyl alcohol; N-vinylaniline, vinylpyridines, N-vinyl-ε-caprolactam, N-vinylpyrrolidone, N-vinylimidazole, N-vinylcarbazole; and the like.

Of these monofunctional monomers, vinyl aromatic compounds and esters of unsaturated carboxylic acids are preferable. Styrene, methyl (meth)acrylate, and the like are particularly preferable.

Among monomers which can be used as the other recurring units, examples of polyfunctional monomers having two or more polymerizable unsaturated groups in the molecule include esters of a compound having two or more hydroxyl groups in the molecule (such as polyhydric alcohols, polyether diol, and polyester diol) and (meth)acrylic acid; addition products of a compound having two or more epoxy groups in the molecule, such as an epoxy resin, and (meth)acrylic acid; condensation products of a compound having two or more amino groups in the molecule and (meth)acrylic acid; and the like. Specific examples include ethylene glycol di(meth)acrylate, diethylene glycol di(meth)acrylate, triethylene glycol di(meth)acrylate, propylene glycol di(meth)acrylate, dipropylene glycol di(meth)acrylate, tripropylene glycol di(meth)acrylate, 1,4-butanediol di(meth)acrylate, trimethylolpropane di(meth)acrylate, trimethylolpropane tri(meth)acrylate, pentaerythritol tri(meth)acrylate, pentaerythritol tetra(meth)acrylate, tricyclodecanedimethanol di(meth)acrylate, 2,5-dimethyl-2,5-hexanediol di(meth)acrylate, N,N'-methylenebis(meth)acrylamide, (poly)alkylene glycol (derivative) di(meth)acrylates such as di(meth)acrylates of ethylene glycol or propylene glycol addition products of bisphenol A, epoxy (meth)acrylates such as di(meth)acrylic acid addition product of bisphenol A diglycidyl ether, and the like.

Of these polyfunctional monomers, ethylene glycol di(meth)acrylate, tricyclodecanedimethanol di(meth)acrylate, 2,5-dimethyl-2,5-hexanediol di(meth)acrylate, di(meth)acrylic acid addition product of bisphenol A diglycidyl ether, and the like are particularly preferable.

An moderate crosslinking structure can be introduced into the resin (A) by using the polyfunctional monomers as the monomer for the other recurring units. This decreases the motility of the polymer molecular chain and hinders heat deformation, thereby improving heat resistance and the like. If the crosslinking structure introduced by the polyfunctional monomer exhibits acid-decomposability, the molecular weight is reduced upon exposure to a greater extent than in the case of a linear resin or in the case where the crosslinking structure does not exhibit acid-decomposability. Because of this, the difference in the dissolution rate in a developer between the exposed area and the unexposed area increases, whereby the resolution can be further improved.

In the following description, the resin (A) comprising the recurring units (1) and (2) and the other recurring units, as required, is referred to as "resin (A1)", the resin (A) comprising the recurring units (1) and (3) and the other recurring units, as required, is referred to as "resin (A2)", and the resin (A) comprising the recurring units (1), (2), and (3) and the other recurring units, as required, is referred to as "resin (A3)".

As specific examples of the preferable resin (A) of the present invention, copolymers made from the following combinations of monomers can be given.

Resin (A1)

p-hydroxystyrene/t-butyl (meth)acrylate copolymer, p-hydroxystyrene/1,1-dimethylpropyl (meth)acrylate copolymer, p-hydroxystyrene/1,1-dimethyl-3-oxobutyl (meth)acrylate copolymer, p-hydroxystyrene/t-butyl (meth)acrylate/styrene copolymer, p-hydroxystyrene/1,1-dimethylpropyl (meth)acrylate/styrene copolymer, p-hydroxystyrene/1,1-dimethyl-3-oxobutyl (meth)acrylate/
    styrene copolymer,
p-hydroxystyrene/t-butyl (meth)acrylate/methyl (meth)
    acrylate copolymer,
p-hydroxystyrene/1,1-dimethylpropyl (meth)acrylate/
    methyl (meth)acrylate copolymer,
p-hydroxystyrene/1,1-dimethyl-3-oxobutyl (meth)acrylate/
    methyl (meth)acrylate copolymer,
p-hydroxystyrene/t-butyl (meth)acrylate/ethylene glycol
    di(meth)acrylate copolymer,
p-hydroxystyrene/1,1-dimethylpropyl (meth)acrylate/
    ethylene glycol di(meth)acrylate copolymer,
p-hydroxystyrene/1,1-dimethyl-3-oxobutyl (meth)acrylate/
    ethylene glycol di(meth)acrylate copolymer,
p-hydroxystyrene/t-butyl (meth)acrylate/
    tricyclodecanedimethanol di(meth)acrylate copolymer,
p-hydroxystyrene/1,1-dimethylpropyl (meth)acrylate/
    tricyclodecanedimethanol di(meth)acrylate copolymer,
p-hydroxystyrene/1,1-dimethyl-3-oxobutyl (meth)acrylate/
    tricyclodecanedimethanol di(meth)acrylate copolymer,
p-hydroxystyrene/t-butyl (meth)acrylate/di(meth)acrylic
    acid addition product of bisphenol A diglycidyl ether
    copolymer,
p-hydroxystyrene/1,1-dimethylpropyl (meth)acrylate/di
    (meth)acrylic acid addition product of bisphenol A diglycidyl ether copolymer,
p-hydroxystyrene/1,1-dimethyl-3-oxobutyl (meth)acrylate/
    di(meth)acrylic acid addition product of bisphenol A
    diglycidyl ether copolymer copolymer,
p-hydroxystyrene/t-butyl (meth)acrylate/2,5-dimethyl-2,5-
    hexanediol di(meth)acrylate copolymer,
p-hydroxystyrene/1,1-dimethylpropyl (meth)acrylate/2,5-
    dimethyl-2,5-hexanediol di(meth)acrylate copolymer,
p-hydroxystyrene/1,1-dimethyl-3-oxobutyl (meth)acrylate/
    2,5-dimethyl-2,5-hexanediol di(meth)acrylate copolymer.

Resin (A2)

p-hydroxystyrene/p-t-butoxystyrene copolymer,
p-hydroxystyrene/p-acetoxystyrene copolymer,
p-hydroxystyrene/p-t-butoxystyrene/styrene copolymer,
p-hydroxystyrene/p-acetoxystyrene/styrene copolymer,
p-hydroxystyrene/p-t-butoxystyrene/methyl (meth)acrylate
    copolymer,
p-hydroxystyrene/p-acetoxystyrene/methyl (meth)acrylate
    copolymer,
p-hydroxystyrene/p-t-butoxystyrene/ethylene glycol
    di(meth)acrylate copolymer,
p-hydroxystyrene/p-acetoxystyrene/ethylene glycol
    di(meth)acrylate copolymer,
p-hydroxystyrene/p-t-butoxystyrene/
    tricyclodecanedimethanol di(meth)acrylate copolymer,
p-hydroxystyrene/p-acetoxystyrene/
    tricyclodecanedimethanol di(meth)acrylate copolymer,
p-hydroxystyrene/p-t-butoxystyrene/di(meth)acrylic acid
    addition product of bisphenol A diglycidyl ether
    copolymer,
p-hydroxystyrene/p-acetoxystyrene/di(meth)acrylic acid
    addition product of bisphenol A diglycidyl ether
    copolymer,
p-hydroxystyrene/p-t-butoxystyrene/2,5-dimethyl-2,5-
    hexanediol di(meth)acrylate copolymer,
p-hydroxystyrene/p-acetoxystyrene/2,5-dimethyl-2,5-
    hexanediol di(meth)acrylate copolymer.

The content of each recurring unit in the resin (A) is as follows.

The content of the recurring unit (1) in the resin (A1), (A2), and (A3) is usually 30–90 mol %, and preferably 50–85 mol % for the total amount of the recurring units (1), (2), and (3).

The content of the recurring unit (2) in the resin (A1) is usually 5–70 mol %, and preferably 5–50 mol % for the total amount of the recurring units (1) and (2). The content of the recurring unit (3) in the resin (A2) is usually 10–50 mol %, and preferably 15–40 mol % for the total amount of the recurring units (1) and (3). The total content of the recurring units (2) and (3) in the resin (A3) is usually 5–70 mol %, and preferably 5–50 mol % for the total amount of the recurring units (1), (2), and (3).

The content of the other recurring units derived from the monofunctional monomers is usually 50 mol % or less, and preferably 40 mol % or less for the total amount of all recurring units. The content of the other recurring unit derived from the polyfunctional monomers is usually 15 wt % or less, and preferably 10 wt % or less for the amount of each resin.

If the content of the recurring unit (1) in each of the resins (A1), (A2), and (A3) is less than 30 mol %, sensitivity as a resist tends to decrease. If the content exceeds 90 mol %, resolution as a resist tends to decrease.

If the content of the recurring unit (2) in the resin (A1) is less than 5 mol %, or if the content of the recurring unit (3) in the resin (A2) is less than 10 mol %, or if the total content of the recurring units (2) and (3) in the resin (A3) is less than 5 mol %, resolution as a resist tends to decrease. If the content of the recurring unit (2) in the resin (A1) exceeds 70 mol %, or if the content of the recurring unit (3) in the resin (A2) exceeds 50 mol %, or if the total content of the recurring units (2) and (3) in the resin (A3) exceeds 70 mol %, sensitivity as a resist tends to decrease.

If the content of the other recurring units derived from the monofunctional monomers in each of the resins (A1), (A2), and (A3) exceeds 50 mol %, resolution as a resist tends to decrease. If the content of the other recurring unit derived from the polyfunctional monomers in the resins (A1), (A2), and (A3) exceeds 15 wt %, solubility in a developer tends to decrease.

The resin (A) is manufactured by, for example, the following methods (a)–(e).

(a) A method of copolymerizing a monomer corresponding to the recurring unit (1) and a monomer corresponding to the recurring unit (2) or a monomer corresponding to the recurring unit (3), or both, together with a monomer corresponding to the other recurring unit, as required, by block polymerization, solution polymerization, precipitation polymerization, emulsion polymerization, suspension polymerization, block-suspension polymerization, or the like using an appropriate radical polymerization initiator, or copolymerizing these monomers by cationic polymerization.

(b) A method of copolymerizing t-butoxystyrenes and a monomer corresponding to the recurring unit (2) together with a monomer corresponding to the other recurring unit, as required, by block polymerization, solution polymerization, precipitation polymerization, emulsion polymerization, suspension polymerization, block-suspension polymerization, or the like using an appropriate radical polymerization initiator, for example, or copolymerizing the monomers by living anionic polymerization and selectively hydrolyzing and/or solvolyzing at least part of t-butyl groups in the copolymer using an acid catalyst.

(c) A method of copolymerizing acetoxystyrenes and a monomer corresponding to the recurring unit (2) together with a monomer corresponding to the other recurring unit, as required, by block polymerization, solution polymerization, precipitation polymerization, emulsion polymerization, suspension polymerization, block-suspension polymerization, or the like using an appropriate radical polymerization initiator, and selectively hydrolyzing and/or solvolyzing at least part of acetyl groups in the copolymer using a basic catalyst.

(d) A method of copolymerizing t-butoxystyrenes together with a monomer corresponding to the other recurring unit, as required, by block polymerization, solution polymerization, precipitation polymerization, emulsion polymerization, suspension polymerization, block-suspension polymerization, or the like using an appropriate radical polymerization initiator, for example, or copolymerizing the monomers by living anionic polymerization and selectively hydrolyzing and/or solvolyzing part of t-butyl groups in the copolymer using an acid catalyst.

(e) A method of copolymerizing acetoxystyrenes together with a monomer corresponding to the other recurring unit, as required, by block polymerization, solution polymerization, precipitation polymerization, emulsion polymerization, suspension polymerization, block-suspension polymerization, or the like using an appropriate radical polymerization initiator, and selectively hydrolyzing and/or solvolyzing part of acetyl groups in the copolymer using a basic catalyst.

The polystyrene-reduced weight average molecular weight of the resin (A) determined by gel permeation chromatography (GPC) (hereinafter referred to as "Mw") is as follows. The Mw of the resin (A) having no crosslinking structure introduced by the polyfunctional monomer is usually 1,000–100,000, preferably 3,000–40,000, and still more preferably 3,000–30,000. If the Mw of the resin (A) is less than 1,000, sensitivity and heat resistance as a resist tend to decrease. If the Mw exceeds 100,000, solubility in a developer tends to decrease.

The ratio of Mw of the resin (A) having no crosslinking structure introduced by the polyfunctional monomer to the polystyrene-reduced number average molecular weight (hereinafter referred to as "Mn") determined by gel permeation chromatography (GPC) (Mw/Mn) is usually 1.0–5.0, preferably 1.0–4.0, and still more preferably 1.0–3.0.

The Mw of the resin (A) having a crosslinking structure introduced by the polyfunctional monomer is usually 3,000–500,000, preferably 5,000–400,000, and still more preferably 8,000–300,000. If the Mw of the resin (A) is less than 3,000, sensitivity and heat resistance as a resist tend to decrease. If the Mw exceeds 500,000, the effect of inhibiting the defective development tends to decrease.

The Mw/Mn of the resin (A) having a crosslinking structure introduced by the polyfunctional monomer is usually 1.5–20.0, and preferably 1.5–15.0.

In the present invention, the resin (A) may comprise other resins (for example, poly(hydroxystyrene)) or compounds with a low molecular weight (for example, 2,2-bis(4-t-butoxyphenyl)propane) which do not impair the uniformity of the coating film formed on the substrate and exhibit compatibility with the resin (A). The total amount of such other resins and low-molecular weight compounds is preferably 50 parts by weight or less for 100 parts by weight of the resin (A).

Photoacid Generator (B)

The component (B) of the present invention is a compound which is shown by the formula (4) and generates an acid upon exposure (hereinafter referred to as "acid generator (B)").

As specific examples of a monovalent organic group having 1–6 carbon atoms for $R^6$–$R^{11}$ in the formula (4), an alkyl group such as a methyl group, ethyl group, n-propyl group, i-propyl group, n-butyl group, i-butyl group, t-butyl group, n-pentyl group, t-amyl group, 1,1-dimethylpropyl group, n-hexyl group, and 1,1-dimethylbutyl group; an alkoxyl group such as a methoxy group, ethoxygroup, n-propoxygroup, i-propoxygroup, n-butoxy group, i-butoxy group, sec-butoxy group, t-butoxy group, n-pentyloxy group, and n-hexyloxy group; an alkoxyalkyl group such as a methoxymethyl group, ethoxymethyl group, 1-methoxyethyl group, 2-methoxyethyl group, 1-ethoxyethyl group, 2-ethoxyethyl group, 3-methoxypropyl group, 3-ethoxypropyl group, 4-methoxybutyl group, and 4-ethoxybutyl group; an alkoxyalkoxyl group such as a methoxymethoxy group, ethoxymethoxy group, 1-methoxyethoxy group, 2-methoxyethoxy group, 1-ethoxyethoxy group, 2-ethoxyethoxy group, 3-methoxypropoxy group, 3-ethoxypropoxy group, 4-methoxybutoxy group, and 4-ethoxybutoxy group; a cyano group; a carboxyl group; —COOX (wherein X represents an alkyl group having 1–5 carbon atoms); a dialkylamino group (wherein the total number of carbon atoms of an alkyl group is 2–6); and the like can be given.

Of these monovalent organic groups, a methyl group, ethyl group, i-propyl group, t-butyl group, t-amyl group, methoxy group, ethoxy group, i-propoxy group, t-butoxy group, methoxymethyl group, ethoxymethyl group, 1-methoxyethyl group, 1-ethoxyethyl group, methoxymethoxy group, ethoxymethoxy group, 1-methoxyethoxy group, 1-ethoxyethoxy group, and the like are preferable.

The 3–8 membered cyclic structure formed by two among $R^6$–$R^8$ bonded together with the carbon atoms which constitutes the benzene ring and the 3–8 membered cyclic structure formed by two among $R^9$–$R^{11}$ bonded together with the carbon atoms which constitutes the benzene ring may be a carbocyclic ring or a heterocyclic ring comprising at least one hetero-atom such as a nitrogen atom, oxygen atom, and sulphur atom.

As the above 3–8 membered cyclic structures, a 5–6 membered carbocyclic structure formed with adjacent two carbon atoms which constitute the benzene ring, a 5–6 membered heterocyclic structure which comprises one or two oxygen atoms as a hetero-atom and is formed with adjacent two carbon atoms which constitute the benzene ring, and the like are preferable.

As specific examples of preferable acid generator (B) of the present invention, compounds shown by the following formulas (5)–(58) and the like can be given.

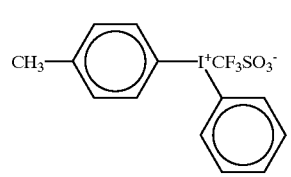

(5)

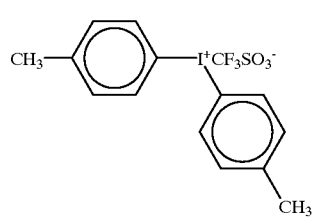

(6)

(7)
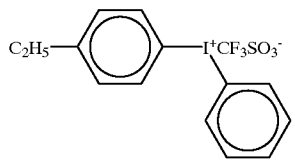
(8)
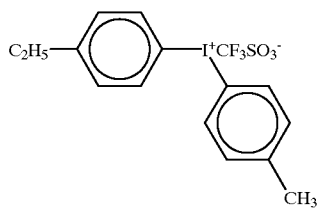
(9)
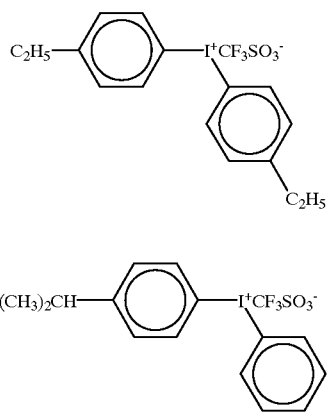
(10)
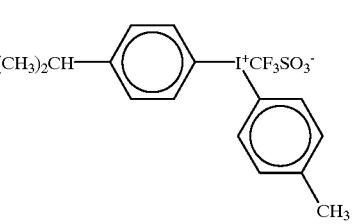
(11)
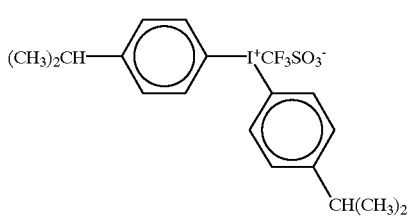
(12)
(13)
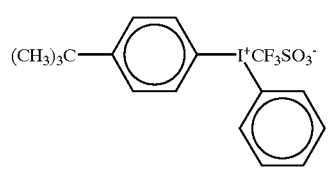
(14)
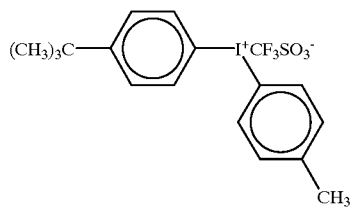
(15)
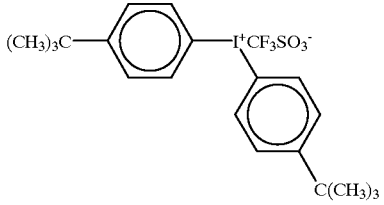
(16)
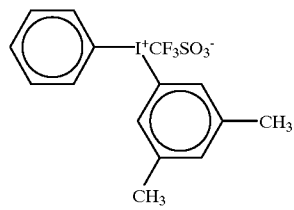
(17)
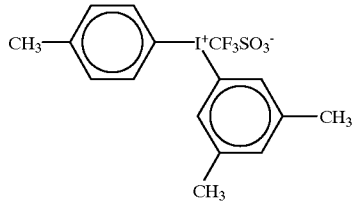
(18)
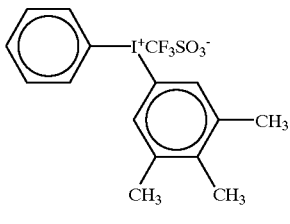
(19)
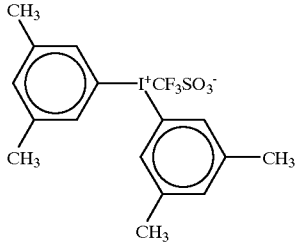
(20)
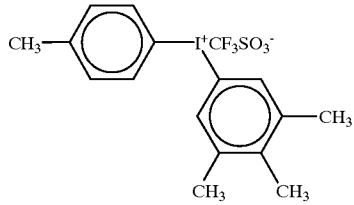

(21) 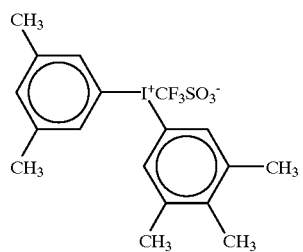
(22) 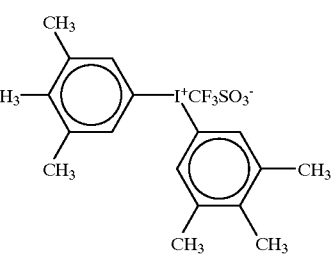
(23) 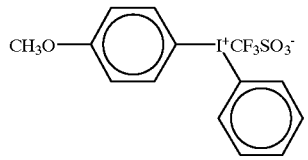
(24) 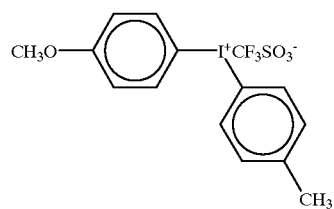
(25) 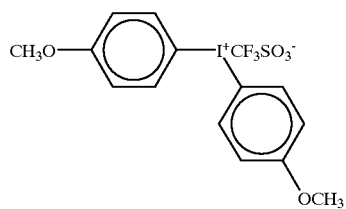
(26) 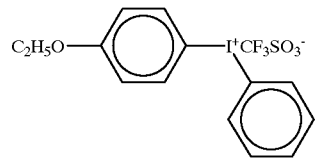
(27) 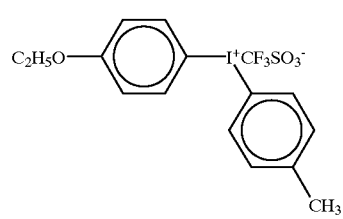
(28) 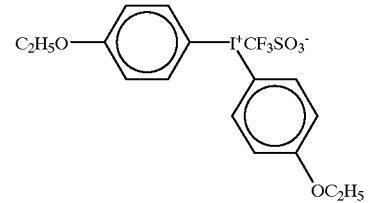
(29) 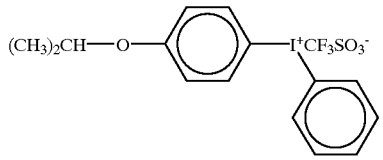
(30) 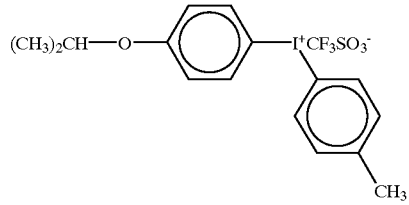
(31) 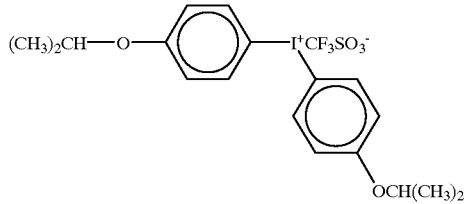
(32) 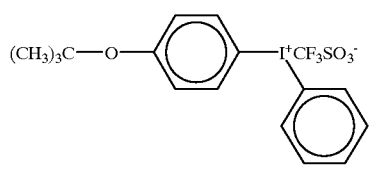
(33) 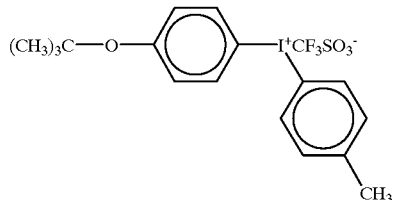
(34) 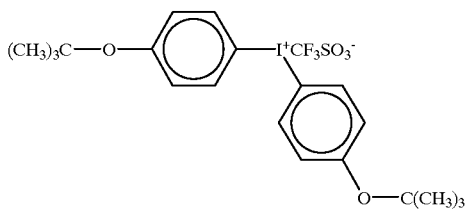

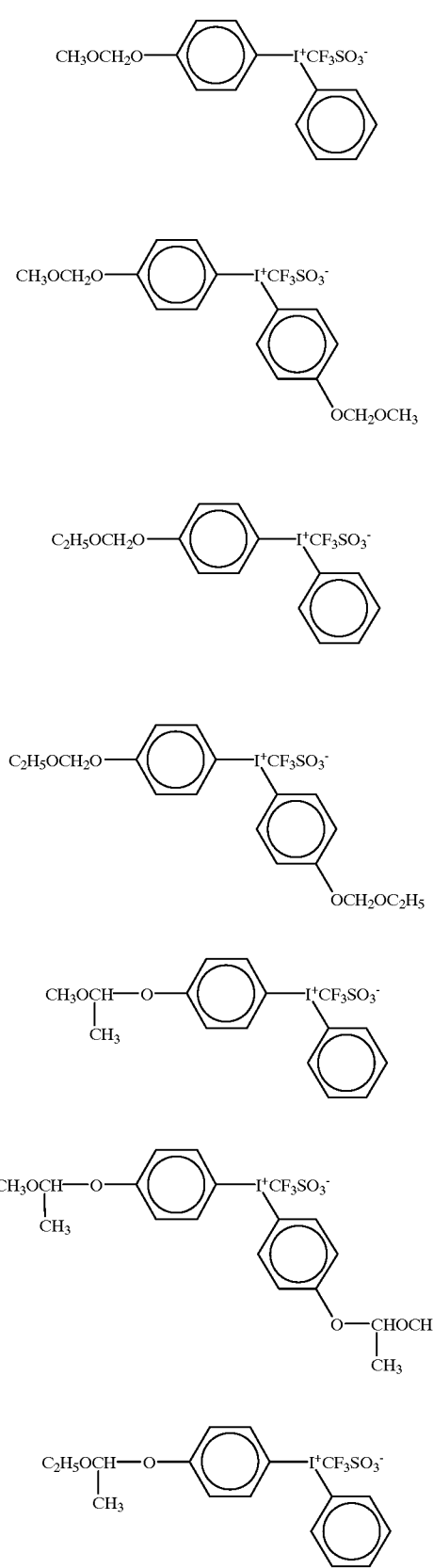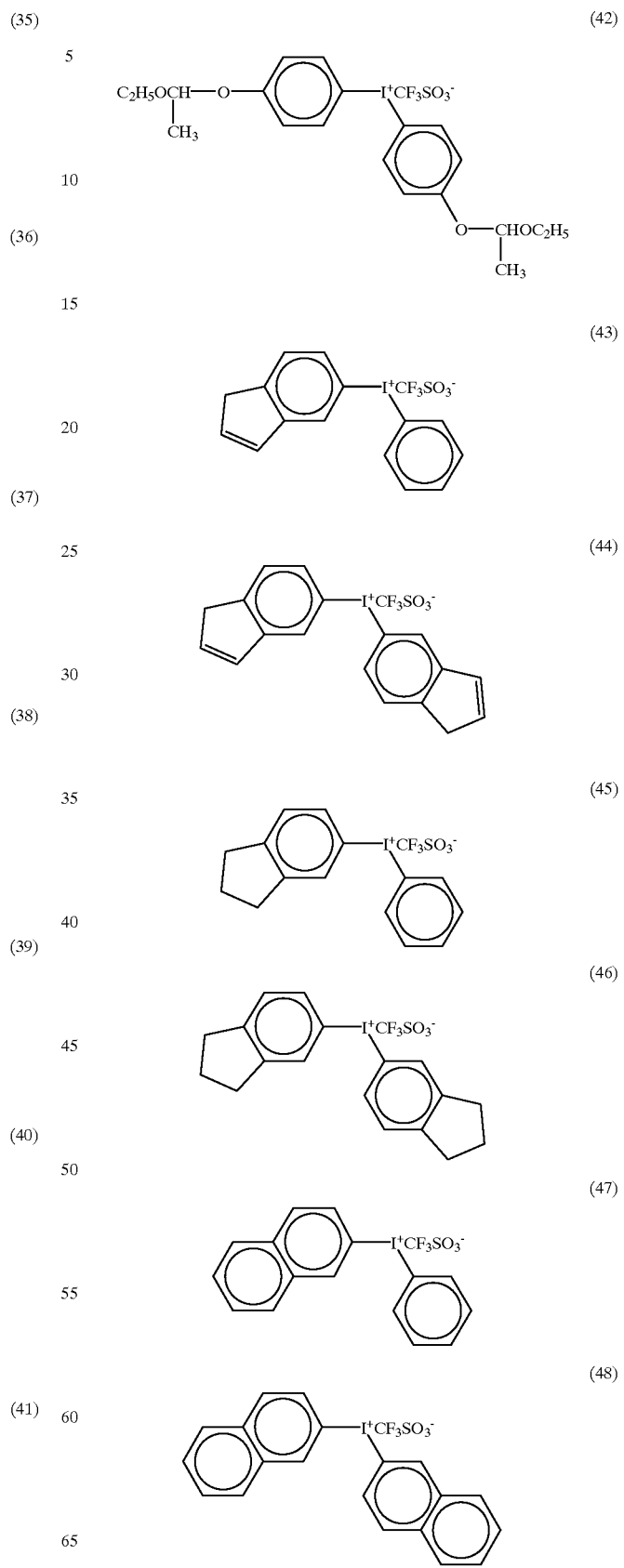

(49) 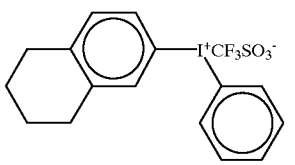

(50) 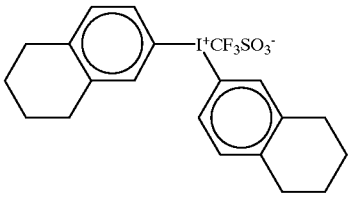

(51) 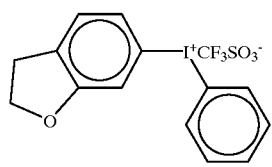

(52) 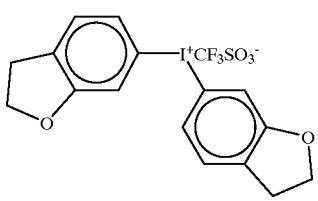

(53) 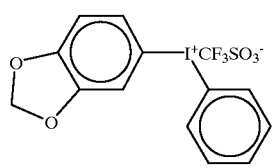

(54) 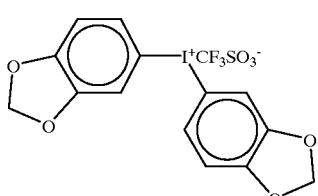

(55) 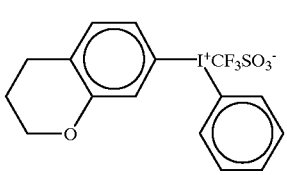

(56) 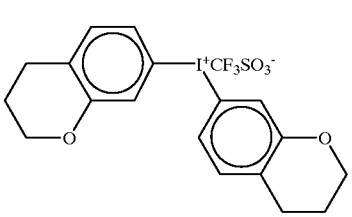

(57) 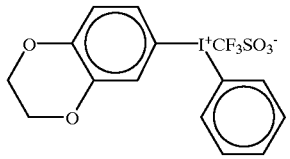

(58) 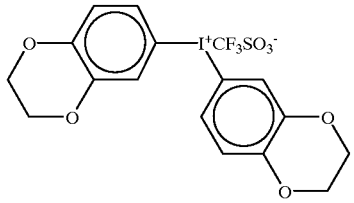

Of these acid generators (B), the compounds shown by the formulas (5), (6), (10), (11), (12), (13), (14), (15), (16), (19), (23), (25), (29), (31), (32), (34), (35), (36), (37), (38), (39), (40), (41), (42), and (54) are particularly preferable.

In the present invention, the acid generator (B) can be used either individually or in combinations of two or more.

The amount of the acid generator (B) to be used in the present invention is usually 0.3–20 parts by weight, and preferably 0.5–10 parts by weight, for 100 parts by weight of the resin (A). If the amount of the acid generator (B) is less than 0.3 part by weight, the effect of inhibiting the defective development tends to be insufficient or the chemical change by the catalytic action of the acid generated upon exposure tends to be insufficient. If the amount exceeds 20 parts by weight, application of the composition may become uneven or scum or the like tends to occur at the time of development.

In the present invention, the following photoacid generators (hereinafter referred to as "other acid generators") can be used in combination with the acid generator (B).

As examples of the other acid generators, onium salt compounds, sulfone compounds, sulfonate compounds, sulfonimide compounds, diazomethane compounds, and the like can be given.

Specific examples of these other acid generators are given below.

Onium Salt Compounds

Specific examples of the onium salt compounds include bis(4-t-butylphenyl)iodonium perfluoro-n-butanesulfonate, bis(4-t-butylphenyl)iodonium 2-trifluoromethylbenzenesulfonate, bis(4-t-butylphenyl)iodonium pyrenesulfonate, bis(4-t-butylphenyl)iodonium n-dodecylbenzenesulfonate, bis(4-t-butylphenyl)iodonium p-toluenesulfonate, bis(4-t-butylphenyl)iodonium benzenesulfonate, bis(4-t-butylphenyl)iodonium 10-camphorsulfonate, bis(4-t-butylphenyl)iodonium n-octanesulfonate, diphenyliodonium perfluoro-n-butanesulfonate, diphenyliodonium trifluoromethanesulfonate, diphenyliodonium 2-trifluoromethylbenzenesulfonate, diphenyliodonium pyrenesulfonate, diphenyliodonium n-dodecylbenzenesulfonate, diphenyliodonium p-toluenesulfonate, diphenyliodonium benzenesulfonate, diphenyliodonium 10-camphorsulfonate, diphenyliodonium n-octanesulfonate, triphenylsulfonium perfluoro-n-butanesulfonate, triphenylsulfonium trifluoromethanesulfonate, triphenylsulfonium 2-trifluoromethylbenzenesulfonate, triphenylsulfonium pyrenesulfonate,
triphenylsulfonium n-dodecylbenzenesulfonate,
triphenylsulfonium p-toluenesulfonate, triphenylsulfonium benzenesulfonate, triphenylsulfonium 10-camphorsulfonate,
triphenylsulfonium n-octanesulfonate,
4-t-butylphenyl-diphenylsulfonium perfluoro-n-butanesulfonate,
4-t-butylphenyl-diphenylsulfonium trifluoromethanesulfonate,
4-t-butylphenyl-diphenylsulfonium 2-trifluoromethylbenzenesulfonate,
4-t-butoxyphenyl-diphenylsulfonium pyrenesulfonate, 4-t-butoxyphenyl-diphenylsulfonium n-dodecylbenzenesulfonate,
4-t-butoxyphenyl-diphenylsulfonium p-toluenesulfonate,
4-t-butoxyphenyl-diphenylsulfonium benzenesulfonate,
4-t-butoxyphenyl-diphenylsulfonium 10-camphorsulfonate, 4-t-butoxyphenyl-diphenylsulfonium n-octanesulfonate, and the like.

Sulfone Compounds

Specific examples of the sulfone compounds include phenacylphenylsulfone, mesitylphenacylsulfone, bis(phenylsulfonyl)methane, 4-trisphenacylsulfone, and the like.

Sulfonate Compounds

Specific examples of the sulfonate compounds include α-methylolbenzoin perfluoro-n-butanesulfonate, α-methylolbenzoin trifluoromethanesulfonate, α-methylolbenzoin 2-trifluoromethylbenzenesulfonate, benzointosylate, methanesulfonic acid triester of pyrogallol, nitrobenzyl-9,10-diethoxyanthracene-2-sulfonate, α-methylolbenzointosylate, α-methylolbenzoin n-octanesulfonate, α-methylolbenzoin n-dodecylbenzenesulfonate, and the like.

Sulfonimide Compounds

Specific examples of the sulfonimide compounds include
N-(perfluoro-n-butylsulfonyloxy)succinimide,
N-(perfluoro-n-butylsulfonyloxy)phthalimide,
N-(perfluoro-n-butylsulfonyloxy)diphenylmaleimide,
N-(perfluoro-n-butylsulfonyloxy)bicyclo[2.2.1]hept-5-ene-2,3-dicarboxyimide,
N-(perfluoro-n-butylsulfonyloxy)-7-oxabicyclo[2.2.1]hept-5-ene-2,3-dicarboxyimide,
N-(perfluoro-n-butylsulfonyloxy)bicyclo[2.2.1]heptane-5,6-oxy-2,3-dicarboxyimide,
N-(perfluoro-n-butylsulfonyloxy)naphthylimide,
N-(trifluoromethylsulfonyloxy)succinimide,
N-(trifluoromethylsulfonyloxy)phthalimide,
N-(trifluoromethylsulfonyloxy)diphenylmaleimide,
N-(trifluoromethylsulfonyloxy)bicyclo[2.2.1]hept-5-ene-2,3-dicarboxyimide,
N-(trifluoromethylsulfonyloxy)-7-oxabicyclo[2.2.1]hept-5-ene-2,3-dicarboxyimide,
N-(trifluoromethylsulfonyloxy)bicyclo[2.2.1]heptane-5,6-oxy-2,3-dicarboxyimide,
N-(trifluoromethylsulfonyloxy)naphthylimide,
N-(2-trifluoromethylphenylsulfonyloxy)succinimide,
N-(2-trifluoromethylphenylsulfonyloxy)phthalimide, N-(2-trifluoromethylphenylsulfonyloxy)diphenylmaleimide,
N-(2-trifluoromethylphenylsulfonyloxy)bicyclo[2.2.1]hept-5-ene-2,3-dicarboxyimido,
N-(2-trifluoromethylphenylsulfonyloxy)-7-oxabicyclo[2.2.1]hept-5-ene-2,3-dicarboxyimide,
N-(2-trifluoromethylphenylsulfonyloxy)bicyclo[2.2.1]heptane-5,6-oxy-2,3-dicarboxyimide,
N-(2-trifluoromethylphenylsulfonyloxy)naphthylimide,
N-(10-camphanylsulfonyloxy)succinimide,
N-(10-camphanylsulfonyloxy)phthalimide,
N-(10-camphanylsulfonyloxy)diphenylmaleimide,
N-(10-camphanylsulfonyloxy)bicyclo[2.2.1]hept-5-ene-2,3-dicarboxyimide, N-(10-camphanylsulfonyloxy)-7-oxabicyclo[2.2.1]hept-5-ene-2,3-dicarboxyimide,
N-(10-camphanylsulfonyloxy)bicyclo[2.2.1]heptane-5,6-oxy-2,3-dicarboxyimide,
N-(10-camphanylsulfonyloxy)aphthylimide,
N-(4-methylphenylsulfonyloxy)succinimide,
N-(4-methylphenylsulfonyloxy)phthalimide,
N-(4-methylphenylsulfonyloxy)diphenylmaleimide,
N-(4-methylphenylsulfonyloxy)bicyclo[2.2.1]hept-5-ene-2,3-dicarboxyimide,
N-(4-methylphenylsulfonyloxy)-7-oxabicyclo[2.2.1]hept-5-ene-2,3-dicarboxyimide,
N-(4-methylphenylsulfonyloxy)bicyclo[2.2.1]heptane-5,6-oxy-2,3-dicarboxyimide,
N-(4-methylphenylsulfonyloxy)naphthylimide,
N-(n-octylsulfonyloxy)succinimide,
N-(n-octylsulfonyloxy)phthalimide,
N-(n-octylsulfonyloxy)diphenylmaleimide,
N-(n-octylsulfonyloxy)bicyclo[2.2.1]hept-5-ene-2,3-dicarboxyimide, N-(n-octylsulfonyloxy)-7-oxabicyclo[2.2.1]hept-5-ene-2,3-dicarboxyimide,
N-(n-octylsulfonyloxy)bicyclo[2.2.1]heptane-5,6-oxy-2,3-dicarboxyimide,
N-(n-octylsulfonyloxy)naphthylimide, and the like.

Disulfonylmethane Compounds

As examples of the disulfonylmethane compounds, compounds shown by the following formula (59) and the like can be given.

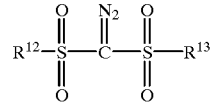

(58)

wherein $R^{12}$ and $R^{13}$ individually represent an acyclic hydrocarbon group having 1–10 carbon atoms, a substituted or unsubstituted cycloalkyl group having 3–10 carbon atoms, a substituted or unsubstituted aryl group having 6–20 carbon atoms, a substituted or unsubstituted aralkyl group having 7–20 carbon atoms, or other monovalent organic groups having a hetero-atom and 1–20 carbon atoms.

The proportion of the other acid generators to be used in the present invention is less than 20 times, and preferably 15 times or less the amount of the acid generator (B) in a molar ratio. If the proportion of the other acid generators exceeds this limit, the effect of inhibiting the defective development may be insufficient.

Acid Diffusion Controller

In the present invention, it is preferable to blend in an acid diffusion controller which controls the diffusion of an acid generated in the resist film by the acid generator (B) and the other acid generators upon exposure, and hinders the unfavorable chemical reaction in the unexposed area. Use of such an acid diffusion controller improves the storage stability of the composition and resolution as a resist. Moreover, line width change of the resist pattern due to PED can be controlled, whereby remarkably superior process stability can be achieved. As the acid diffusion controller, nitrogen-containing organic compounds of which the basicity does not change when exposed or heated are preferable.

Specific examples of such organic compounds include compounds shown by the formula $R^{14}R^{15}R^{16}N$ (wherein $R^{14}$, $R^{15}$, and $R^{16}$ individually represent a hydrogen atom, a substituted or unsubstituted alkyl group, a substituted or unsubstituted aryl group, or substituted or unsubstituted aralkyl group) (hereinafter referred to as "nitrogen-containing compound (I)"), diamino compounds having two nitrogen atoms in the molecule (hereinafter referred to as "nitrogen-containing compound (II)"), polymers having at least three nitrogen atoms (hereinafter referred to as "nitrogen-containing compound (III)"), compounds containing an amide group, urea compounds, heterocyclic compounds containing nitrogen, and the like.

Examples of the nitrogen-containing compound (I) include monoalkylamines such as n-hexylamine, n-heptylamine, n-octylamine, n-nonylamine, n-decylamine, and monoethanolamine; dialkylamines such as di-n-butylamine, di-n-pentylamine, di-n-hexylamine, di-n-heptylamine, di-n-octylamine, di-n-nonylamine, di-n-decylamine, and diethanolamine; trialkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, and triethanolamine; and aromatic amines such as aniline, N-methylaniline, N,N-dimethylaniline, 2-methylaniline, 3-methylaniline, 4-methylaniline, 4-nitroaniline, diphenylamine, triphenylamine, and 1-naphthylamine.

Examples of the nitrogen-containing compound (II) include ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4'-aminophenyl)propane, 2-(3'-aminophenyl)-2-(4'-aminophenyl)propane, 2-(4'-aminophenyl)-2-(3'-hydroxyphenyl)propane, 2-(4'-aminophenyl)-2-(4'-hydroxyphenyl)propane, 1,4-bis[1'-(4"-aminophenyl)-1'-methylethyl]benzene, 1,3-bis[1'-(4"-aminophenyl)-1'-methylethyl]benzene, and the like.

As examples of the nitrogen-containing compound (III), polyethyleneimine, polyallylamine, a polymer of dimethylaminoethylacrylamide, and the like can be given.

Examples of the amide group-containing compounds include formamide, N-methylformamide, N,N-dimethylformamide, acetamide, N-methylacetamide, N,N-dimethylacetamide, propionamide, benzamide, pyrrolidone, N-methylpyrrolidone, and the like.

Examples of the urea compounds include urea, methylurea, 1,1-dimethylurea, 1,3-dimethylurea, 1,1,3,3-tetramethylurea, 1,3-diphenylurea, tri-n-butylthiourea, and the like. Examples of the nitrogen-containing heterocyclic compounds include imidazoles such as imidazole, benzimidazole, 4-methylimidazole, and 4-methyl-2-phenylimidazole; pyridines such as pyridine, 2-methylpyridine, 4-methylpyridine, 2-ethylpyridine, 4-ethylpyridine, 2-phenylpyridine, 4-phenylpyridine, N-methyl-4-phenylpyridine, nicotine, nicotinic acid, nicotinamide, quinoline, 8-oxyquinoline, and acridine; pyrazine, pyrazole, pyridazine, quinoxaline, purine, pyrrolidine, piperidine, morpholine, 4-methylmorpholine, piperazine, 1,4-dimethylpiperazine, 1,4-diazabicyclo[2.2.2] octane; and the like.

Of these nitrogen-containing organic compounds, the nitrogen-containing compound (I) and the nitrogen-containing heterocyclic compound are preferable. Trialkylamines are particularly preferable among the nitrogen-containing compound (I), and pyridines are particularly preferable among the nitrogen-containing heterocyclic compounds.

In the present invention, the acid diffusion controller can be used either individually or in combinations of two or more.

The amount of the acid diffusion controller to be used is usually 15 parts by weight or less, preferably 0.001–10 parts by weight, and still more preferably 0.005–5 parts by weight for 100 parts by weight of the resin (A). If the amount of the acid diffusion controller exceeds 15 parts by weight, sensitivity as a resist and developability of the exposed area tend to decrease. If the amount is less than 0.001 part by weight, the pattern shape or dimensional accuracy may decrease depending on the processing conditions.

Other Additives

Various additives such as surfactants and sensitizers can be optionally added to the radiation-sensitive resin composition of the present invention.

The surfactants improve the applicability or striation of the composition and developability as a resist.

Examples of surfactants include polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate; and commercially available products such as FTOP EF301, EF303, EF352 (manufactured by TOHKEM PRODUCTS CORPORATION), MEGAFAC F171, F173 (manufactured by Dainippon Ink and Chemicals, Inc.), Fluorard FC430, FC431 (manufactured by Sumitomo 3M Ltd.), Asahi Guard AG710, Surflon S-382, SC-101, SC-102, SC-103, SC-104, SC-105, SC-106 (manufactured by Asahi Glass Co., Ltd.), KP341 (manufactured by Shin-Etsu Chemical Co., Ltd.), and Polyflow No. 75, No. 95 (manufactured by Kyoeisha Chemical Co., Ltd.).

These surfactants may be used either individually or in combinations of two or more.

The amount of the surfactants to be added is usually 2 parts by weight or less for 100 parts by weight of the resin (A).

The sensitizers absorb the energy of the radiation and transmit the energy to the acid generator (B) or the other acid generators, thereby increasing the amount of acid to be generated upon exposure. The sensitizers improve the apparent sensitivity as a resist.

As preferable examples of the sensitizers, benzophenones, rose bengals, anthracenes, and the like can be given.

These sensitizers may be used either individually or in combinations of two or more. The amount of sensitizers to be added is usually 50 parts by weight or less for 100 parts by weight of the resin (A).

The addition of dyes or pigments, or both, visualizes the latent image of the exposed area to relax the effect of halation at the time of exposure. Use of adhesion adjuvants improves adhesiveness to the substrate.

As other additives, halation inhibitors such as 4-hydroxy-4'-methylchalcone, form improvers, storage stabilizers, antifoaming agents, and the like can be added.

Solvent

The radiation-sensitive resin composition of the present invention is prepared as a composition solution when used in practice by homogeneously dissolving the composition in a solvent so that the total solid concentration is 1–50 wt %, and preferably 3–40 wt %, and filtering the solution using a filter with a pore diameter of about 0.2 µm.

As examples of the solvent used for preparing the composition solution, ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate; propylene glycol monoalkyl ethers such as propylene glycol monomethyl ether, propylene glycol monoethyl ether, propylene glycol mono-n-propyl ether, and propylene glycol mono-n-butyl ether; propylene glycol dialkyl ethers such as propylene glycol dimethyl ether, propylene glycol diethyl ether, propylene glycol di-n-propyl ether, and propylene glycol di-n-butyl ether; propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate; lactic acid esters such as methyl lactate, ethyl lactate, n-propyl lactate, and i-propyl lactate; aliphatic carboxylic acid esters such as n-amyl formate, i-amyl formate, ethyl acetate, n-propyl acetate, i-propyl acetate, n-butyl acetate, i-butyl acetate, n-amyl acetate, i-amyl acetate, i-propyl propionate, n-butyl propionate, and i-butyl propionate; other esters such as ethyl hydroxyacetate, ethyl 2-hydroxy-2-methylpropionate, methyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, butyl 3-methoxyacetate, butyl 3-methyl-3-methoxyacetate, butyl 3-methyl-3-methoxypropionate, butyl 3-methyl-3-methoxybutyrate, methyl acetoacetate, ethyl acetoacetate, methyl pyruvate, and ethyl pyruvate; aromatic hydrocarbons such as toluene and xylene; ketones such as methyl ethyl ketone, methyl n-propyl ketone, methyl n-butyl ketone, 2-heptanone, 3-heptanone, 4-heptanone, and cyclohexanone; amides such as N-methylformamide, N,N-dimethylformamide, N-methylacetamide, N,N-dimethyl acetamide, and N-methylpyrrolidone; lactones such as γ-butyrolactone; and the like can be given.

These solvents may be used either individually or in combinations of two or more.

Formation of Resist Pattern

The resist pattern is formed from the radiation-sensitive resin composition of the present invention by applying the above-described composition solution to a substrate such as a silicon wafer, wafer coated with aluminum, wafer coated with silicon nitride, or wafer coated with an organic lower layer reflection preventive film by rotational coating, cast coating, roll coating, and the like to form a resist film. The resist film is optionally treated by a pre-bake (hereinafter referred to as "PB") at 70–160° C. for 30 minutes or more. The resist film is then exposed through a specific mask pattern. As examples of the radiation used for exposure, i-rays (wavelength: 365 nm), far ultraviolet rays such as an ArF excimer laser (wavelength: 193 nm) and KrF excimer laser (wavelength: 248 nm), charged particle rays such as electron beams, X-rays such as synchrotron radiation, and the like are appropriately used depending on the type of acid generator (B) and the other acid generators. Of these, far ultraviolet rays and charged particle rays are preferable. The exposure conditions such as the amount of exposure are appropriately determined depending on the composition of the radiation-sensitive resin composition, type of additives, and the like.

In the present invention, it is preferable to perform a post-exposure bake (hereinafter referred to as "PEB") after exposure at 70–160° C., in particular, at 120–160° C. for 30 minutes or more in order to steadily form, with high accuracy, a minute resist pattern which excels in resolution, developability, pattern form, PED stability, and the like. If the heating temperature for PEB is less than 70° C., PED stability tends to decrease.

The exposed resist film is then developed using an alkaline developer at 10–50° C. for 30–200 seconds to form a predetermined resist pattern.

As the alkaline developer, an alkaline aqueous solution prepared by dissolving at least one alkaline compound such as alkaline metal hydroxide, aqueous ammonia, mono-, di-, or tri-alkylamine, mono-, di-, or tri-alkanolamine, heterocyclic amine, tetraalkylammonium hydroxide, corrin, 1,8-diazabicyclo[5.4.0]-7-undecene, and 1,5-diazabicyclo[4.3.0]-5-nonene to a concentration of 1–10 wt %, and preferably 1–5 wt % is used.

Moreover, an appropriate amount of a water-soluble organic solvent such as methanol and ethanol or surfactants can be added to the developer comprising the above alkaline aqueous solution.

When using the developer comprising an alkaline aqueous solution, the resist film is washed with water after development.

When forming the resist pattern, a protective film may be provided on the resist film in order to prevent the effect of basic impurities and the like included in the environmental atmosphere.

EXAMPLES

The present invention will be described in detail by examples, which should not be construed as limiting the present invention.

Measurement of Mw and Mw/Mn and evaluation of each resist in the examples and comparative examples were carried out as follows.

Mw and Mw/Mn

Mw and Mw/Mn were measured by gel permeation chromatography (GPC) with monodispersed polystyrene as a standard reference material using a GPC column (manufactured by Tosoh Corp., G2000H$^{XL}$×2, G3000H$^{XL}$×1, G4000H$^{XL}$×1) under the following analysis conditions. Flow rate: 1.0 ml/minute, eluate: tetrahydrofuran, column temperature: 40° C.

Sensitivity

When forming a line and space pattern (1L1S) with a design line width of 0.26 $\mu$m, exposure at which a one-to-one 1L1S was formed was determined as an optimum exposure, which was taken as the sensitivity.

Resolution

When forming a line and space pattern (1L1S) with a design line width of 0.26 $\mu$m, a minimum dimension ($\mu$m) of the resist pattern resolved at the optimum exposure was taken as the resolution of the resist film.

Defective Development

Defective development was evaluated by both a method of observing the presence or absence of the defective development using an optical microscope, and a method using a KLA defect inspection system (manufactured by KLA-TENCOR JAPAN LTD.). Method using a KLA defect inspection device:

The total number of defective clusters and unclusters extracted from the difference between the image caused by superposing the pixels and a reference image was detected by observing in an array mode. The total number of defects was detected by adjusting the sensitivity of the system so as to be able to detect the defects with 0.15 $\mu$m or more.

In the evaluation, in the case where the defective development was not observed using an optical microscope and the total number of defects detected by the method using the KLA defect inspection system was less than 10 per wafer, defective development was evaluated as "Good". In the case where the defective development was observed using an optical microscope, or the total number of defects was 10 or more per wafer, the defective development was evaluated as "Bad".

PED Stability

A specimen exposed at a dose equivalent to the optimum exposure in the case where the specimen was developed after performing PEB immediately after exposure was allowed to stand in a chamber in which the ammonia concentration was controlled at 5 ppb and subjected to PEB. The specimen was developed to form a line and space pattern (1L1S) with a design line width of 0.26 μm. The line width of the top of the pattern ($L_{top}$) was measured using a scanning electron microscope to evaluate the PED stability by the following criteria.

$0.26 \times 0.85 < L_{top} < 0.26 \times 1.1$: Good $0.26 \times 0.85 \geq L_{top}$: Bad (narrow)

$0.26 \times 0.85 \leq L_{top}$: Bad (wide)

Synthesis of Resin (A)

Synthesis Example 1

107 g of p-acetoxystyrene, 50 g of t-butyl methacrylate, 6 g of azobisisobutyronitrile, and 1 g of t-dodecylmercaptan were dissolved in 160 g of propylene glycol monomethyl ether. The mixture was polymerized for 16 hours while maintaining the reaction temperature at 70° C. in a nitrogen atmosphere. After polymerization, the reaction solution was added dropwise to a large quantity of hexane to coagulate and purify the resulting resin. After the addition of 150 g of propylene glycol monomethyl ether to the purified resin, 300 g of methanol, 80 g of triethylamine, and 15 g of water were added and the mixture was hydrolyzed for 8 hours while refluxing at the boiling point. After the reaction, the solvent and triethylamine were evaporated under reduced pressure. The resulting resin was dissolved in acetone and was added dropwise to a large quantity of water to coagulate the resin. The resulting white powder was filtered, and dried overnight at 50° C. under reduced pressure.

The Mw and Mw/Mn of this resin were 12,000 and 1.7, respectively. The copolymerization molar ratio of p-hydroxystyrene to t-butyl methacrylate determined by a $^{13}$C-NMR analysis was 64:36. This resin is referred to as "resin (A1-1)".

Synthesis Example 2

100 g of p-acetoxystyrene, 25 g of t-butyl acrylate, 18 g of styrene, 6 g of azobisisobutyronitrile, and 1 g of t-dodecylmercaptan were dissolved in 230 g of propylene glycol monomethyl ether. The mixture was polymerized for 16 hours while maintaining the reaction temperature at 70° C. in a nitrogen atmosphere. After polymerization, the reaction solution was added dropwise to a large quantity of hexane to coagulate and purify the resulting resin. After the addition of 150 g of propylene glycol monomethyl ether to the purified resin, 300 g of methanol, 80 g of triethylamine, and 15 g of water were added and the mixture was hydrolyzed for 8 hours while refluxing at the boiling point. After the reaction, the solvent and triethylamine were evaporated under reduced pressure. The resulting resin was dissolved in acetone and was added dropwise to a large quantity of water to coagulate the resin. The resulting white powder was filtered, and dried overnight at 50° C. under reduced pressure.

The Mw and Mw/Mn of this resin were 11,500 and 1.6, respectively. The copolymerization molar ratio of p-hydroxystyrene: t-butyl acrylate: styrene determined by a $^{13}$C-NMR analysis was 61:19:20. This resin is referred to as "resin (A1-2)".

Synthesis Example 3

125 g of p-acetoxystyrene, 20 g of t-butyl acrylate, 10 g of styrene, 8 g of 2,5-dimethyl-2,5-hexanediol diacrylate, 8 g of azobisisobutyronitrile, and 6 g of t-dodecylmercaptan were dissolved in 170 g of propylene glycol monomethyl ether. The mixture was polymerized for 16 hours while maintaining the reaction temperature at 70° C. in a nitrogen atmosphere. After polymerization, the reaction solution was added dropwise to a large quantity of hexane to coagulate and purify the resulting resin. After the addition of 150 g of propylene glycol monomethyl ether to the purified resin, 300 g of methanol, 80 g of triethylamine, and 15 g of water were added, and the mixture was hydrolyzed for 8 hours while refluxing at a boiling point. After the reaction, the solvent and triethylamine were evaporated under reduced pressure. The resulting resin was dissolved in acetone and was added dropwise to a large quantity of water to coagulate the resin. The resulting white powder was filtered, and dried overnight at 50° C. under reduced pressure.

The Mw and Mw/Mn of this resin were 40,000 and 2.6, respectively. The copolymerization molar ratio of p-hydroxystyrene: t-butyl acrylate: styrene: 2,5-dimethyl-2, 5-hexanediol diacrylate determined by a $^{13}$C-NMR analysis was 72:10:15:3. This resin is referred to as "resin (A1-3)".

Synthesis Example 4

176 g of p-t-butoxystyrene was anionically polymerizaed in 250 g of tetrahydrofuran at −78° C. using sec-butyllithium as a catalyst. After polymerization, the resulting resin solution was coagulated in methanol to obtain a white resin. This resin was dissolved in 600 g of dioxane. After the addition of diluted hydrochloric acid, the mixture was hydrolyzed at 70° C. The reaction solution was added dropwise to a large quantity of water to coagulate the resin to obtain a white resin. A step of dissolving the resulting resin in acetone and adding dropwise to a large quantity of water to coagulate the resin was repeated. The resulting white powder was filtered, and dried overnight at 50° C. under reduced pressure.

The Mw and Mw/Mn of this resin were 10,400 and 1.01, respectively. As a result of a $^{13}$C-NMR analysis, this resin had a structure in which part of the t-butyl groups in poly(p-t-butoxystyrene) was hydrolyzed and was found to be a copolymer in which the molar ratio of p-t-butoxystyrene to p-hydroxystyrene is 68:32. This resin is referred to as "resin (A2-1)".

Synthesis Example 5

160 g of p-acetoxystyrene, 6 g of azobisisobutyronitrile, and 1 g of t-dodecylmercaptan were dissolved in 230 g of propylene glycol monomethyl ether. The mixture was polymerized for 20 hours while maintaining the reaction temperature at 75° C. in a nitrogen atmosphere. After polymerization, the reaction solution was added dropwise to a large quantity of hexane to coagulate and purify the resulting resin. After the addition of 150 g of propylene glycol monomethyl ether to the purified resin, 300 g of methanol, 10 g of triethylamine, and 30 g of water were added. The mixture was hydrolyzed for one hour while refluxing at the boiling point. After the reaction, the solvent and triethylamine were evaporated under reduced pressure. The resulting resin was dissolved in acetone and was added dropwise to a large quantity of water to coagulate the resin. The resulting white powder was filtered and was dried overnight at 50° C. under reduced pressure.

The Mw and Mw/Mn of this resin were 9,500 and 1.5, respectively. As a result of a $^{13}$C-NMR analysis, this resin was a copolymer having a structure in which part of the acetyl groups in poly(p-t-acetoxystyrene) was hydrolyzed and the molar ratio of p-hydroxystyrene to p-acetoxystyrene was 70:30. This resin is referred to as "resin (A2-2)".

Synthesis of Other Resin

Comparative Synthesis Example 1

7.0 g of di-t-butylcarbonate was added to a solution in which 12 g of poly(p-hydroxystyrene) and 5 g of triethylamine were dissolved in 50 g of dioxane while stirring. After stirring the mixture at room temperature for 6 hours, oxalic acid was added to neutralize triethylamine. The reaction solution was added dropwise to a large quantity of water to coagulate the resin. After washing the coagulated resin with pure water several times, the resin was filtered and dried overnight at 50° C. under reduced pressure.

The Mw and Mw/Mn of this resin were 9,200 and 1.8, respectively. This resin had a structure in which 30 mol % of hydrogen atoms of phenolic hydroxyl groups in poly(p-hydroxystyrene) was replaced with a t-butoxycarbonyl group. This resin is referred to as "resin (a-1)".

Examples 1–12 and Comparative Examples 1–3

Components shown in Table 1 were mixed to prepare a homogeneous solution (in Table 1, part(s) indicates part(s) by weight). The solution was filtered using a membrane filter with a pore diameter of 0.2 μm to prepare a composition solution.

The composition solution was spin-coated onto a silicon wafer. PB was then performed under the conditions shown in Table 2 to form a resist film with a thickness of 0.7 μm.

The resist film was exposed and subjected to PEB under the conditions shown in Table 2. After development at 23° C. for 1 minute by a paddle method using a 2.38 wt % tetramethyl ammonium hydroxide aqueous solution, the resist film was washed with pure water and dried to form a positive-tone resist pattern. In Table 2, a KrF excimer laser exposure apparatus "NSR-2205EX12A" (manufactured Nikon) was used as a light source for a KrF excimer laser, and a "Hitachi HL700D" (manufactured by Hitachi, Ltd.) was used as a light source for electron beams (the acceleration voltage was remodelled at 50 KeV).

As for the resin (a-1) in Comparative Example 1, because the pattern was not formed after development when heated at 130° C. or more due to the low resolution temperature, PB and PEB were performed at a temperature appropriate for the resin.

For evaluating PED stability, two silicon wafers which were spin-coated, pre-baked, and exposed were prepared for each resist. PEB was performed for one of each resist immediately after exposure, and the others were subjected to PEB after being allowed to stand in a chamber in which the ammonia concentration in the atmosphere was adjusted to 5 ppb.

The evaluation results for each resist are shown in Table 3.

Acid generators, acid diffusion controllers, other additives, and solvents used in the examples and comparative examples are as follows.

Acid Generator (B)

B-1: Bis(4-t-butylphenyl)iodonium trifluoromethanesulfonate (formula (15))
B-2: 4-methoxyphenyl-phenyliodonium trifluoromethanesulfonate (formula (23))
B-3: Bis(3,5-dimethylphenyl)iodonium trifluoromethanesulfonate (formula (19))
B-4: Bis[4-(I'-ethoxyethoxy)phenyl]iodonium trifluoromethanesulfonate (formula (42))
B-5: Compound shown by formula (54)

Other Acid Generator b-1: Bis(4-t-butylphenyl)iodonium 10-camphorsulfonate
b-2: Triphenylsulfonium trifluoromethanesulfonate
b-3: 4-t-butoxyphenyl-diphenylsulfonium p-toluenesulfonate Acid Diffusion Controller C-1: Tri-n-hexylamine
C-2: Triethanolamine
C-3: 2-phenylpyridine Other Additives D-1: Poly(p-hydroxystyrene) (Mw=8,000)
D-2: 2,2-bis(4-t-butoxyphenyl)propane Solvent E-1: Ethyl lactate
E-2: Ethyl 3-ethoxy propionate
E-3: Propylene glycol monomethyl ether acetate

TABLE 1

| | Resin (part(s)) | Acid generator (part(s)) | Acid diffusion controller (part(s)) | Other additives (part(s)) | Solvent (part(s)) |
|---|---|---|---|---|---|
| Example 1 | A1-1 (100) | B-1 (2) b-1 (3) | C-1 (0.30) | — | E-1 (400) E-2 (200) |
| Example 2 | A1-1 (100) | B-2 (2) b-2 (1) b-3 (2) | C-1 (0.25) | D-1 (20) | E-1 (400) E-2 (200) |
| Example 3 | A1-2 (100) | B-1 (1) b-1 (4) | C-1 (0.25) C-2 (0.05) | — | E-1 (300) E-3 (300) |
| Example 4 | A1-2 (100) | B-4 (3) b-3 (1) | C-1 (0.30) | — | E-1 (600) |
| Example 5 | A1-3 (100) | B-1 (3) b-1 (2) | C-1 (0.20) C-3 (0.05) | — | E-1 (200) E-3 (400) |
| Example 6 | A1-3 (100) | B-3 (3) b-1 (2) | C-1 (0.15) C-2 (0.05) | — | E-1 (400) E-2 (200) |
| Example 7 | A2-1 (100) | B-1 (2) b-1 (2) | C-1 (0.30) | — | E-1 (400) E-2 (200) |
| Example 8 | A2-1 (100) | B-2 (1) b-3 (3) | C-2 (0.15) C-3 (0.05) | — | E-1 (500) E-2 (100) |
| Example 9 | A2-2 (100) | B-3 (2) b-3 (3) | C-1 (0.30) | — | E-1 (400) E-2 (200) |
| Example 10 | A2-2 (100) | B-1 (2) b-1 (3) | C-1 (0.20) C-2 (0.05) | D-2 (10) | E-1 (400) E-3 (200) |
| Example 11 | A2-2 (100) | B-2 (4) b-1 (2) | C-1 (0.35) | — | E-1 (400) E-2 (200) |
| Example 12 | A1-1 (50) A2-1 (50) | B-5 (2) b-1 (3) | C-1 (0.35) | — | E-1 (400) E-2 (200) |
| Comparative Example 1 | a-1 | B-1 (3) | C-1 (0.30) | — | E-1 (400) E-2 (200) |
| Comparative Example 2 | A1-1 (100) | b-1 (1) b-3 (3) | C-1 (0.30) | — | E-1 (400) E-2 (200) |
| Comparative Example 3 | A2-1 (100) | b-2 (4) | C-1 (0.30) | — | E-1 (600) |

TABLE 2

| | PB | | | PEB | |
|---|---|---|---|---|---|
| | Temp. (° C.) | Time (sec.) | Exposure light source | Temp. (° C.) | Time (sec.) |
| Example 1 | 130 | 60 | KrF excimer laser | 130 | 60 |
| Example 2 | 120 | 90 | KrF excimer laser | 130 | 90 |
| Example 3 | 130 | 60 | KrF excimer laser | 140 | 60 |
| Example 4 | 130 | 45 | KrF excimer laser | 145 | 45 |

TABLE 2-continued

| | PB | | | PEB | |
|---|---|---|---|---|---|
| | Temp. (° C.) | Time (sec.) | Exposure light source | Temp. (° C.) | Time (sec.) |
| Example 5 | 130 | 60 | KrF excimer laser | 130 | 60 |
| Example 6 | 130 | 60 | KrF excimer laser | 130 | 60 |
| Example 7 | 130 | 60 | KrF excimer laser | 130 | 60 |
| Example 8 | 120 | 60 | KrF excimer laser | 130 | 60 |
| Example 9 | 140 | 120 | Electron beams | 150 | 90 |
| Example 10 | 130 | 60 | KrF excimer laser | 130 | 60 |
| Example 11 | 130 | 60 | KrF excimer laser | 130 | 60 |
| Example 12 | 120 | 60 | KrF excimer laser | 130 | 60 |
| Comparative Example 1 | 90 | 60 | KrF excimer laser | 110 | 60 |
| Comparative Example 2 | 130 | 60 | KrF excimer laser | 130 | 60 |
| Comparative Example 3 | 130 | 60 | KrF excimer laser | 130 | 60 |

TABLE 3

| | Sensitivity | Resolution ($\mu$m) | Defective development | PED stability |
|---|---|---|---|---|
| Example 1 | 24 mJ/cm$^2$ | 0.21 | Good | Good |
| Example 2 | 23 mJ/cm$^2$ | 0.22 | Good | Good |
| Example 3 | 28 mJ/cm$^2$ | 0.22 | Good | Good |
| Example 4 | 22 mJ/cm$^2$ | 0.22 | Good | Good |
| Example 5 | 21 mJ/cm$^2$ | 0.22 | Good | Good |
| Example 6 | 28 mJ/cm$^2$ | 0.21 | Good | Good |
| Example 7 | 19 mJ/cm$^2$ | 0.21 | Good | Good |
| Example 8 | 31 mJ/cm$^2$ | 0.22 | Good | Good |
| Example 9 | 5 $\mu$C/cm$^2$ | 0.22 | Good | Good |
| Example 10 | 28 mJ/cm$^2$ | 0.22 | Good | Good |
| Example 11 | 28 mJ/cm$^2$ | 0.21 | Good | Good |
| Example 12 | 29 mJ/cm$^2$ | 0.22 | Good | Good |
| Comparative Example 1 | 21 mJ/cm$^2$ | 0.25 | Bad | Bad (wide) |
| Comparative Example 2 | 26 mJ/cm$^2$ | 0.25 | Bad | Good |
| Comparative Example 3 | 35 mJ/cm$^2$ | 0.24 | Bad | Good |

The radiation-sensitive resin composition of the present invention exhibits no defective development and does not cause the line width to vary nor the resist pattern to change into a T-shape due to PED. The radiation-sensitive resin composition exhibits high sensitivity to various types of radiation such as far ultraviolet rays, charged particle rays, and X-rays and excels in resolution. Therefore, the radiation-sensitive resin composition of the present invention can be suitably used as a chemically-amplified resist for manufacturing semiconductor devices, which will become more and more minute.

Obviously, numerous modifications and variations of the present invention are possible in light of the above teachings. It is therefore to be understood that, within the scope of the appended claims, the invention may be practiced otherwise than as specifically described herein.

What is claimed is:

1. A radiation-sensitive resin composition comprising:

(a) a resin which comprises:

a recurring unit (1) shown by the following formula (1),
    either or both of a recurring unit (2) shown by the following formula (2) and a recurring unit (3) shown by the following formula (3):

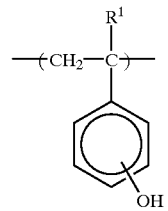

(1)

wherein $R^1$ represents a hydrogen atom or a methyl group;

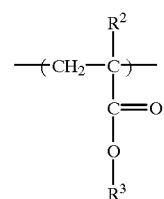

(2)

wherein $R^2$ represents a hydrogen atom or a methyl group and $R^3$ represents a tertiary alkyl group having 4–10 carbon atoms or a 1,1-dimethyl-3-oxobutyl group;

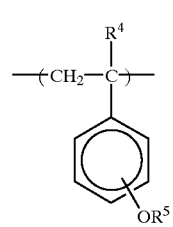

(3)

wherein $R^4$ represents a hydrogen atom or a methyl group and $R^5$ represents a t-butyl group or acetyl group, and wherein said resin comprises at least one recurring unit other than the recurring units (1), (2), and (3) containing a unit derived from polyfunctional monomers which has at least two polymerizable unsaturated groups in the molecule; and (B) a photoacid generator shown by the following formula (4):

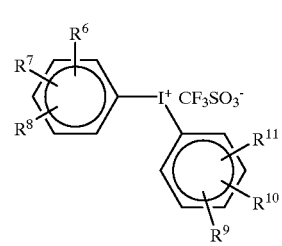

(4)

wherein (a) $R^6$–$R^{11}$ individually represent a hydrogen atom or a monovalent organic group having 1–6 carbon atoms, provided that at least one of $R^6$–$R^{11}$ represents a group other than a hydrogen atom, (b) two groups among $R^6$–$R^8$ form a 3–8 membered cyclic structure together with the carbon atoms of the benzene ring to which these groups are bonded, with the remaining group and $R^9$–$R^{11}$ being a hydrogen atom or a monovalent organic group having 1–6 carbon atoms, (c) two groups among $R^9$–$R^{11}$ form a 3–8 membered cyclic structure together with the carbon atoms in the benzene ring to which these groups are bonded, with the remaining group and $R^6$–$R^8$ being a hydrogen atom or a monovalent organic group having 1–6 carbon atoms, or (d) two groups among $R^6$–$R^8$ form a 3–8 membered cyclic structure together with the carbon atoms of the benzene ring to which these groups are bonded, with the remaining group being a hydrogen atom or a monovalent organic group having 1–6 carbon atoms and two groups among $R^9$–$R^{11}$ form a 3–8 membered cyclic structure together with the carbon atoms in the benzene ring to which these groups are bonded, with the remaining group being a hydrogen atom or a monovalent organic group having 1–6 carbon atoms.

2. The radiation-sensitive resin composition according to claim 1, wherein the recurring unit (1) in the resin (A) is derived from p-hydroxystyrene.

3. The radiation-sensitive resin composition according to claim 1, wherein the group represented by $R^3$ in the formula (2) showing the recurring unit (2) is at least one group selected from a group consisting of a t-butyl group, 1,1-dimethylpropyl group, and 1,1-dimethyl-3-oxobutyl group.

4. The radiation-sensitive resin composition according to claim 1, wherein the recurring unit (3) in the resin (A) is derived from at least one of p-t-butoxystyrene and p-acetyloxystyrene.

5. The radiation-sensitive resin composition according to claim 1, wherein recurring units other than the recurring units (1), (2), and (3) have a unit derived from at least one of styrene and methyl (meth)acrylate.

6. The radiation-sensitive resin composition according to claim 1, wherein the polyfunctional monomers are at least one compound selected from a group consisting of ethylene glycol di(meth)acrylate, tricyclodecanedimethanol di(meth)acrylate, 2,5-dimethyl-2,5-hexanediol di(meth)acrylate, and di(meth)acrylic acid addition product of bisphenol A diglycidyl ether.

7. The radiation-sensitive resin composition according to claim 1, wherein the content of the recurring unit (1) in the resin (A) is 30–90 mol % for the total amount of the recurring units (1), (2), and (3).

8. The radiation-sensitive resin composition according to claim 1, wherein the resin (A) has a crosslinking structure introduced by the polyfunctional monomers and the Mw of the resin (A) is 3,000–500,000.

9. The radiation-sensitive resin composition according to claim 1, wherein the resin (A) has a crosslinking structure introduced by the polyfunctional monomers and the Mw/Mn of the resin (A) is 1.5–20.0.

10. The radiation-sensitive resin composition according to claim 1, wherein $R^6$ to $R^{11}$ in the formula (4) showing the acid generator (B) represent at least one selected from a group consisting of a hydrogen atom, a methyl group, ethyl group, i-propyl group, t-butyl group, t-amyl group, methoxy group, ethoxy group, i-propoxy group, t-butoxy group, methoxymethyl group, ethoxymethyl group, 1-methoxyethyl group, 1-ethoxyethyl group, methoxymethoxy group, ethoxymethoxy group, 1-methoxyethoxy group, and 1-ethoxyethoxy group.

11. The radiation-sensitive resin composition according to claim 1, wherein the amount of the acid generator (B) is 0.3–20 parts by weight for 100 parts by weight of the resin (A).

12. The radiation-sensitive resin composition according to claim 1, further comprising at least one acid generator other than the acid generator (B) which is selected from a group consisting of onium salt compounds, sulfone compounds, sulfonate compounds, sulfonimide compounds, and diazomethane compounds.

13. The radiation-sensitive resin composition according to claim 1, comprising the resin (A), acid generator (B), and an acid diffusion controller.

14. The radiation-sensitive resin composition according to claim 13, wherein the acid diffusion controller is a compound containing nitrogen.

15. A radiation-sensitive resin composition comprising:
(a) a resin which comprises a recurring unit (1) shown by the following formula (1), a recurring unit (3) shown by the following formula (3), and a recurring unit derived from styrene:

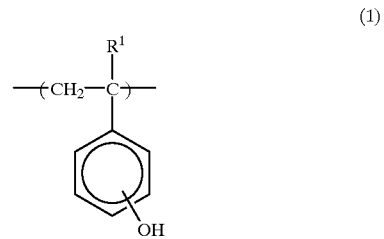

(1)

wherein $R^1$ represents a hydrogen atom or a methyl group;

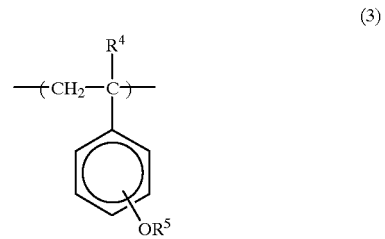

(3)

wherein $R^4$ represents a hydrogen atom or a methyl group and $R^5$ represents a t-butyl group or acetyl group; and
(b) a photoacid generator shown by the following formula (4):

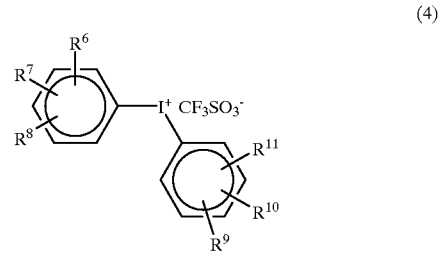

(4)

wherein (a) $R^6$–$R^{11}$ individually represent a hydrogen atom or a monovalent organic group having 1–6 carbon atoms, (b) two groups among $R^6$–$R^8$ form a 3–8 membered cyclic structure together with the carbon atoms or the benzene ring to which these groups are bonded, with the remaining group and $R^9$–$R^{11}$ being a hydrogen atom or a monovalent organic group having 1–6 carbon atoms, (c) two groups among $R^9$–$R^{11}$ form a 3–8 membered cyclic structure together with the carbon atoms in the benzene ring to which these groups are bonded, with the remaining group and $R^6$–$R^8$ being a hydrogen atom or a monovalent organic group having 1–6 carbon atoms, or (d) two groups among $R^6$–$R^8$ form a 3–8 membered cyclic structure together with the carbon atoms or the benzene ring to which these groups are bonded, with the remaining group being a hydrogen atom or a monovalent organic group having 1–6 carbon atoms, and two groups among $R^9$–$R^{11}$ form a 3–8 membered cyclic structure together with the carbon atoms in the benzene ring to which these groups are bonded, with the remaining group being a hydrogen atom or a monovalent organic group having 1–6 carbon atoms; provided that at least one of $R^6$–$R^{11}$ represents a group other than a hydrogen atom.

16. The radiation-sensitive resin composition according to claim 15, further comprising at least one acid generator other than the acid generator (B) which is selected from a group consisting of onium salt compounds, sulfone compounds, sulfonate compounds, sulfonimide compounds, and diazomethane compounds.

17. The radiation-sensitive resin composition according to claim 15, comprising the resin (A), acid generator (B), and an acid diffusion controller.

18. The radiation-sensitive resin composition according to claim 17, wherein the acid diffusion controller is a compound containing nitrogen.

19. The radiation-sensitive resin composition according to claim 15, exhibiting resolution as a resist of 0.22 μm or less.

20. A radiation-sensitive resin composition comprising:

(A) a resin which comprises a recurring unit (1) shown by the following formula (1) and either or both of a recurring unit (2) shown by the following formula (2) and a recurring unit (3) shown by the following formula (3):

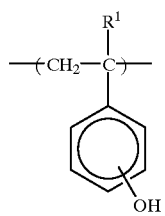
(1)

wherein $R^1$ represents a hydrogen atom or a methyl group;

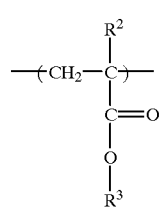
(2)

wherein $R^2$ represents a hydrogen atom or a methyl group and $R^3$ represents a tertiary alkyl group having 4–10 carbon atoms or a 1,1-dimethyl-3-oxobutyl group;

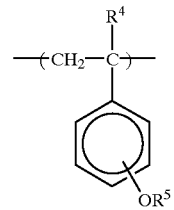
(3)

wherein $R^4$ represents a hydrogen atom or a methyl group and $R^5$ represents a t-butyl group or acetyl group; and (B) a photoacid generator shown by the following formula (4):

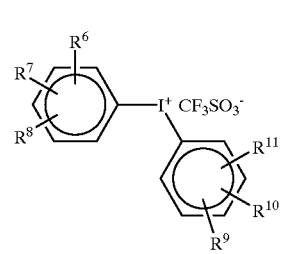
(4)

wherein (a) $R^6$–$R^{11}$ individually represent a hydrogen atom or a monovalent organic group having 1–6 carbon atoms, provided that at least one of $R^6$–$R^{11}$ represents a group other than a hydrogen atom, (b) two groups among $R^6$–$R^8$ form a 3–8 membered cyclic structure together with the carbon atoms of the benzene ring to which these groups are bonded, with the remaining group and $R^9$–$R^{11}$ being a hydrogen atom or a monovalent organic group having 1–6 carbon atoms, (c) two groups among $R^9$–$R^{11}$ form a 3–8 membered cyclic structure together with the carbon atoms in the benzene ring to which these groups are bonded, with the remaining group and $R^6$–$R^8$ being a hydrogen atom or a monovalent organic group having 1–6 carbon toms, or (d) two groups among $R^6$–$R^8$ form a 3–8 membered cyclic structure together with the carbon atoms of the benzene ring to which these groups are bonded, with the remaining group being a hydrogen atom or a monovalent organic group having 1–6 carbon atoms, and two groups among $R^9$–$R^{11}$ form a 3–8 membered cyclic structure together with the carbon atoms in the benzene ring to which these groups are bonded, with the remaining group being a hydrogen atom or a monovalent organic group having 1–6 carbon atoms; and at least one acid generator other than the acid generator (B) which is selected from a group consisting of bis(4-t-butylphenyl)iodonium 10-camphorsulfonate, triphenylsulfonium trifluoromethanesulfonate, and 4-t-butoxyphenyl-diphenylsulfonium p-toluenesulfonate.

21. The radiation-sensitive resin composition according to claim 20, wherein the recurring unit (1) in the resin (A) is derived from p-hydroxystyrene.

22. The radiation-sensitive resin composition according to claim 20, wherein the group represented by $R^3$ in the formula (2) showing the recurring unit (2) is at least one group selected from a group consisting of a t-butyl group, 1,1-dimethylpropyl group, and 1,1-dimethyl-3-oxobutyl group.

23. The radiation-sensitive resin composition according to claim 20, wherein the recurring unit (3) in the resin (A) is derived from at least one of p-t-butoxystyrene and p-acetyloxystyrene.

24. The radiation-sensitive resin composition according to claim 20, wherein recurring units other than the recurring units (1), (2) and (3) have a unit derived from at least one of styrene and methyl (meth)acrylate.

25. The radiation-sensitive resin composition according to claim 20, exhibiting resolution as a resist of 0.22 μm or less.

* * * * *